United States Patent [19]
Tseng et al.

[11] Patent Number: 5,830,802
[45] Date of Patent: Nov. 3, 1998

[54] PROCESS FOR REDUCING HALOGEN CONCENTRATION IN A MATERIAL LAYER DURING SEMICONDUCTOR DEVICE FABRICATION

[75] Inventors: Hsing-Huang Tseng; Philip J. Tobin; Bikas Maiti, all of Austin, Tex.

[73] Assignee: Motorola Inc., Schaumburg, Ill.

[21] Appl. No.: 521,720

[22] Filed: Aug. 31, 1995

[51] Int. Cl.$^6$ .................................................. H01L 21/311
[52] U.S. Cl. .................. 438/592; 438/476; 148/DIG. 60; 148/DIG. 147
[58] Field of Search .......................... 437/10, 12, 40 GS, 437/41 GS, 200, 201; 148/DIG. 60, DIG. 147; 438/471, 476, 592, 143

[56] References Cited

U.S. PATENT DOCUMENTS

| | | | |
|---|---|---|---|
| 5,364,803 | 11/1994 | Lur et al. | 437/200 |
| 5,527,718 | 6/1996 | Seita et al. | 437/12 |
| 5,552,332 | 9/1996 | Tseng et al. | 437/41 |
| 5,567,638 | 10/1996 | Lin et al. | 437/46 |

FOREIGN PATENT DOCUMENTS

| | | |
|---|---|---|
| 6-104203 | 4/1994 | Japan . |
| 6-267973 | 9/1994 | Japan . |
| 7-249763 | 9/1995 | Japan . |

OTHER PUBLICATIONS

Y.H. Lin, et al., Jpn. J. Appl. Phys., 34 (1/2B)(1995)752, "... oxide gettering effect in polys–si gate", Feb. 1995.

Th. Eriksson et al., J. Appl. Phys., 68(5)(1990)2112, "Removal of process–induced fluorine . . . hydrogen–containing atmosphere", Sep. 1990.

M. Fukumoto et al., Appl. Phys. Lett., 50(14)(1987)894, "Fluorine distribution in a CVD WSi/ polycrystalline silicon composite gate structure", Apr. 1987.

S. Wolf, Silicon Processing for the VLSI Era, vol. II, pp. 194–195, 198–199, 397–398, Jun. 1990.

Peter J. Wright et al., "The Effect of Fluorine in Silicon Dioxide Gate Dielectrics", IEEE TED–vol. 36, No. 5, May 1989, pp. 879–889.

Hsing H. Tseng et al., "The Effect of Silicon Gate Microstructure and Gate Oxide Process on Threshold Volt Instabilities in p+ –Gate p–Channel MOSFET's with Fluorine . . . ", IEEE TED vol.39,No.7,pp. 1687–1693.

Paul G.Y. Tsui et al., "Suppression of MOSFET Reverse Short Channel Effect by N2O Gate Poly Reoxidation Process", 1994 IEDM San Francisco, California,Dec. 11–14, pp. 501–504.

S. Kusunold et al., "Hot–Carrier–Resistant Structure by Re–oxidized Nitride Oxide Sidewall For Highly Reliable and High Performance LDD MOSFETS", 1991 IEEE, pp. 25.4.1–25.4.4.

J.D.Hayden, et al., "A High–Performance Quadruple Well, Quadruple Poly BiCMOS Process for Fast 16Mb SRAMs", APRDL, Motorola, Austin, Texas, pp. 1–4.

*Primary Examiner*—Charles L. Bowers, Jr.
*Assistant Examiner*—Leon Radomsky

[57] ABSTRACT

A process for reducing halogen concentration in a material layer (56) includes the deposition of a dielectric layer (58) overlying the material layer (56). An annealing process is carried out to diffuse halogen atoms from the material layer (56) into the overlying dielectric layer (58). Once the diffusion process is complete, the dielectric layer (58) is removed.

17 Claims, 1 Drawing Sheet

PROCESS FOR REDUCING HALOGEN CONCENTRATION IN A MATERIAL LAYER DURING SEMICONDUCTOR DEVICE FABRICATION

RELATED APPLICATION

Related material is disclosed in commonly assigned, co-pending patent application entitled "Process For Fabricating A MOSFET Device Having Reduced Reverse Short Channel Effects" Ser. No. 08/460,339, filed Jun. 2, 1995.

FIELD OF THE INVENTION

This invention relates in general to a method for fabricating a semiconductor device, and more particularly, to a method for reducing halogen atom concentration in a material layer formed during a semiconductor fabrication process.

BACKGROUND OF THE INVENTION

As the demand for high speed, high performance semiconductor devices continues to grow, technologists are turning to advanced materials for fabrication of conductive structures, such as gate electrodes, metal interconnects, contact structures, and the like. In order to reduce the electrical resistance of conductive structures in a semiconductor device often refractory-metals are combined with polycrystalline silicon to form a low resistance alloy known as a refractory-metal silicide.

Although various methods can be used for the formation of a refractory-metal silicide layer, the preferred technique continues to be chemical-vapor-deposition (CVD) using a fluorinated source gas, such as tungsten hexafluoride. During the deposition process, fluorine disassociates from tungsten and becomes incorporated in the growing tungsten silicide layer. Since fluorine is a highly mobile species, subsequent thermal processing steps carried out to complete the fabrication of a semiconductor device cause the fluorine to diffuse into underlying layers. Diffusion of fluorine atoms into dielectric layers such as thin gate dielectric layers underlying a gate electrode, can result in substantial deterioration of device performance. For example, the charge to breakdown characteristics of a gate dielectric layer can be severely impaired by a high concentration of fluorine in the gate dielectric layer.

In addition to the deleterious effects associated with the presence of fluorine in a gate dielectric layer, the diffusing action of the fluorine atoms can enhance the diffusion of boron from polycrystalline silicon and into the substrate. For example, diffusion of fluorine can cause boron in a P+ gate electrode material to diffuse through the gate oxide layer and into the underlying silicon substrate. The addition of boron to the channel region of a metal-oxide-semiconductor (MOS) transistor can result in unstable threshold voltage and further degrade charge to breakdown values. Accordingly, processing improvements are necessary to reduce the concentration of halogen atoms in material layers, such as refractory-metal silicide layers, formed during semiconductor device fabrication.

SUMMARY OF THE INVENTION

In practicing the present invention there is provided a process for reducing the halogen concentration in a material layer formed during a semiconductor device fabrication process. The process of the invention employs a disposable dielectric layer having the capability to absorb halogen atoms during an annealing process. Once the halogen is absorbed by the dielectric layer, the dielectric layer is removed and conventional process steps can be carried out to form a reliable semiconductor device. In one embodiment of the invention, a material layer characterized by a first halogen concentration is formed on a semiconductor substrate. A dielectric layer is formed to overlie the material layer and thermal energy is applied to diffuse halogen from the material layer and into the dielectric layer. The diffusion process creates a second halogen concentration in the material layer. The second halogen concentration is substantially less than the first halogen concentration. In the final inventive step, the dielectric layer is removed.

Figure 1:
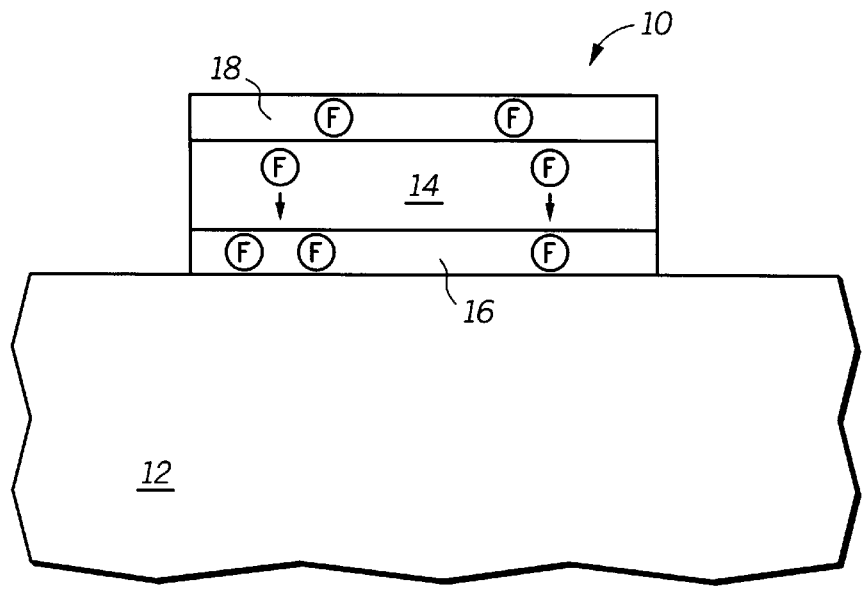
FIG. 1 illustrates, in cross-section, a gate electrode formed in accordance with the prior art.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

Detailed Description of Preferred Embodiments

The present invention provides a process for removing halogen atoms from material layers used in the fabrication of semiconductor devices. Removal of halogen atoms from the material layers is desirable to reduce the migration of halogen atoms within a semiconductor device during device fabrication. For example, migration of fluorine to a gate oxide layer in an MOS transistor, can reduce the charge to breakdown resistance of the gate oxide layer. The process of the invention provides a porous dielectric material, which upon annealing, absorbs halogen atoms from underlying material layers. Once the absorption of halogen atoms is complete, the dielectric layer is removed and subsequent processing steps are carried out to complete the fabrication of a semiconductor device.

Shown in FIG. 1 is a portion of a semiconductor device fabricated in accordance with the prior art. A gate electrode 10 is formed on a semiconductor substrate 12. Gate electrode 10 includes a polycrystalline silicon layer 14 separated from semiconductor substrate 12 by a gate oxide layer 16. A tungsten silicide layer 18 overlies polycrystalline silicon layer 14.

In processing methods of the prior art, tungsten silicide layer 18 is formed by chemical vapor deposition using tungsten hexafluoride ($WF_6$) and silane ($SiH_4$) source gases. During the chemical vapor deposition process, a portion of the fluorine in the $WF_6$ molecule becomes incorporated into the growing tungsten silicide layer. Upon exposure to heat during subsequent fabrication processes, the fluorine diffuses through polycrystalline silicon layer 14 and into gate oxide layer 16. Once the fluorine diffuses to the gate oxide layer, the ability of gate oxide layer 16 to support a voltage potential between semiconductor substrate 12 and gate electrode 10 is substantially reduced. Additionally, where polycrystalline silicon layer 14 is fabricated to be a P-type material, such as through implantation of boron or boron difluoride, the fluorine diffusion process can induce the penetration of boron atoms into semiconductor substrate 12.

Figure 2:
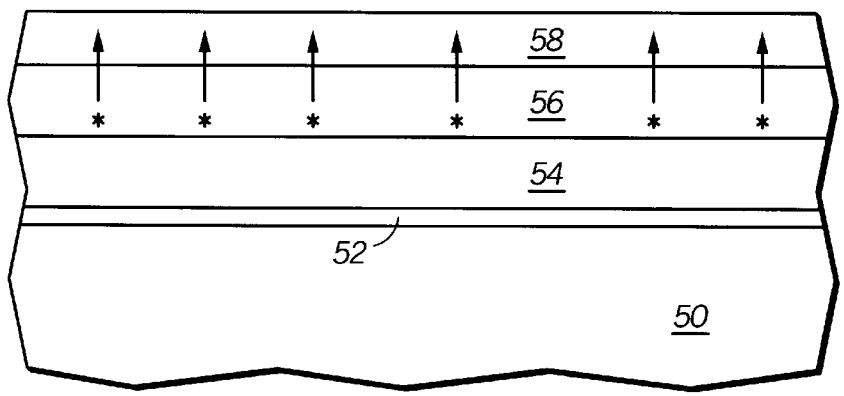
FIG. 2 illustrates a process step in accordance with the invention in which halogen atoms are diffused from a material layer and into a disposable dielectric layer.

Shown in FIG. 2 is a cross-sectional view of a semiconductor substrate 50 having already undergone several process steps in accordance with one embodiment of the invention. A dielectric layer 52 overlies the surface of semiconductor substrate 50. A polycrystalline silicon layer 54 overlies dielectric layer 52. A refractory metal silicide layer 56 overlies polycrystalline silicon layer 54. Both polycrystalline silicon layer 54 and refractory metal silicide layer 56 are formed by chemical vapor deposition.

Once these layers are deposited, a dielectric layer 58 is deposited to overlie refractory metal silicide layer 56. Preferably, dielectric layer 58 is silicon dioxide deposited by chemical vapor deposition using tetraethylorthosilane (TEOS) source gas. In a preferred method, dielectric layer 58 is deposited by plasma-enhanced-chemical-vapor-deposition (PECVD).

In the PECVD process, the silicon dioxide is only deposited on the front side of the semiconductor wafers, rather than on both the front and back sides as in a conventional chemical vapor deposition system. The deposition characteristics of a PECVD system is important to the present invention in view of the necessary removal of dielectric layer 58 prior to subsequent processing to complete the fabrication of a semiconductor device. Alternatively, a conventional chemical vapor deposition process can be used to form dielectric layer 58.

Once dielectric layer 58 is formed, thermal energy is applied to diffuse halogen atoms, such as fluorine, from refractory-metal silicide layer 56 and into dielectric layer 58. The halogen atoms are denoted by the asterisks in FIG. 2. The thermal energy can be applied by a convective furnace annealing alone, or by a combination of furnace annealing and radiative annealing in a rapid thermal annealing apparatus. In a preferred embodiment of the invention, the thermal energy is applied by a combination of convective and radiative heating to diffuse halogen into dielectric layer 58.

In the two step annealing process, the first radiative annealing step is by rapid thermal annealing carried out at a temperature of about 900° to 950° C. for about 20 to 40 seconds. Then, a second annealing step is carried out in a convective furnace at a temperature of about 700° to 900° C. for a period of about 15 to 40 minutes. During the annealing process, halogen atoms diffuse to dielectric layer 58 and attach to dangling silicon bonds present in the porous structure of dielectric layer 58. Alternatively, the order can be reversed and the furnace annealing step can be performed prior to the rapid thermal annealing process. In yet another alternative, halogen can be diffused into dielectric layer 58 by furnace annealing alone carried out at a temperature of about 700° to 900° C. for a predetermined time period.

Figure 3:
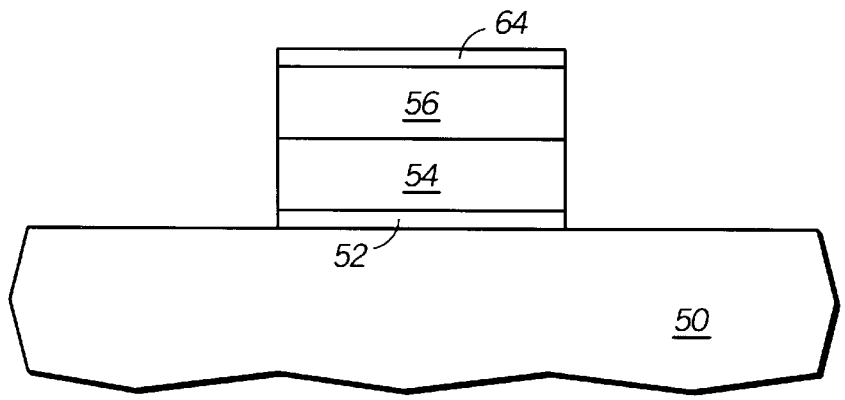
FIG. 3 illustrates, in cross-section, a silicided gate electrode formed in accordance with the invention.

After the halogen diffusion process is complete, and halogen atoms have been absorbed by dielectric layer 58, the dielectric layer is removed and a silicon nitride layer 64 is deposited to overlie refractory-metal silicide layer 56, as illustrated in FIG. 3. Next, a gate electrode is formed by sequentially etching silicon nitride layer 64, refractory-metal silicide layer 56, polycrystalline silicon layer 54, and dielectric layer 52.

It is important to note that upon fabrication of a gate electrode, in accordance with the process of the invention, that halogen has been substantially removed from refractory-metal silicide layer 56. During subsequent thermal processing steps, the diffusion of halogen atoms to dielectric layer 58 will be reduced. Subsequent thermal processing steps typically include, for example, annealing to adjust the grain structure in the gate electrode materials, a reoxidation step to form an oxide layer on the side walls of gate electrode structures, source-drain implant annealing, and the like. Since halogen has been substantially removed from material layers, such as refractory-metal silicide layer 56, the thermal processing steps can be carried out without reducing the dielectric integrity of gate dielectric layers, such as dielectric layer 52. Accordingly, deleterious effects from halogen diffusion in an MOS transistor incorporating a gate electrode fabricated in accordance with the invention will be reduced.

Those skilled in the art will appreciate that other material layers having a halogenated atom component can be deposited by chemical vapor deposition. The halogenated atom reducing method of the invention is not limited to tungsten silicide and to the reduction of fluorine atoms. Rather, the invention comprehends the reduction of any halogen constituent within a material layer deposited in such a way that a large halogen concentration remains in the material layer.

Thus it is apparent that there has been provided, in accordance with the invention, a process for reducing the halogen concentration in a material layer formed during semiconductor device fabrication, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, halogen concentration reduction in contact structures employing refractory-metals is contemplated by the present invention. Furthermore, many different kinds of deposition equipment, such as cluster tools and the like can be used. It is therefore intended to include within the invention all such variations and modifications as fall within the scope of the appended claims and equivalents thereof.

We claim:

1. A process for fabricating a semiconductor device comprising the steps of:

providing a semiconductor substrate having a device layer thereon;

placing the semiconductor substrate in a deposition apparatus and introducing deposition gases including a halogenated source gas;

forming a refractory-metal silicide layer on the device layer, the refractory-metal silicide layer having a first halogen concentration therein;

depositing a silicon dioxide layer overlying the refractory-metal silicide layer, applying thermal energy to diffuse halogen from the refractory-metal silicide layer into the silicon dioxide layer, and to leave a second halogen concentration in the refractory-metal silicide layer, wherein; the second halogen concentration is less than the first halogen concentration; and this step includes substeps of:
   applying radiant energy; and
   applying convective energy; and removing the silicon dioxide layer.

2. The process of claim 1, wherein the step of depositing a silicon dioxide layer comprises plasma enhanced chemical vapor deposition of silicon dioxide using tetraethoxyorthosilane source gas.

3. The process of claim 1, wherein the step of depositing a silicon dioxide layer comprises chemical vapor deposition of silicon dioxide using tetraethoxyorthosilane source gas.

4. The process of claim 1, wherein the step of introducing a halogenated source gas comprises tungsten hexafluoride.

5. The process of claim 1, wherein the step of removing the silicon dioxide layer comprises chemical etching in a liquid bath.

6. The process of claim 1, wherein the step of applying thermal energy comprises exposing the semiconductor substrate to thermal energy selected from the group consisting of radiative energy and convective energy.

7. A process for fabricating a semiconductor device comprising the steps of:
   providing a semiconductor substrate;
   forming a material layer on the semiconductor substrate, wherein the material layer is characterized by a first halogen concentration;
   depositing a dielectric layer overlying the material layer;
   applying thermal energy to diffuse halogen from the material layer and into the dielectric layer, thereby creating a second halogen concentration in the material layer, wherein;
       second concentration is substantially less than the first concentration of halogen; and
       this step includes the substeps of:
           applying radiant energy; and
           applying convective energy; and
   removing the dielectric layer.

8. The process of claim 7, wherein the step of forming a material layer comprises depositing a metal layer using a fluorinated source gas.

9. The process of claim 8, wherein the fluorinated source gas comprises tungsten hexafluoride.

10. The process of claim 7, wherein the step of applying convective energy:
    is performed at a temperature between 700° and 900° C.

11. A process for fabricating a semiconductor device comprising the steps of:
    providing a semiconductor substrate having a device layer thereon;
    placing the semiconductor substrate in a deposition apparatus and introducing deposition gases including a tungsten hexafluoride and silane;
    forming a tungsten silicide layer on the device layer;
    depositing a silicon dioxide layer overlying the tungsten silicide layer;
    annealing the semiconductor substrate to diffuse fluorine from the tungsten silicide layer and into the silicon dioxide layer, wherein the steps of
    annealing includes the substeps of:
        applying radiant energy; and
        applying convective energy; and
    removing the silicon dioxide layer.

12. The process of claim 11, wherein the step of depositing a silicon dioxide layer comprises plasma enhanced chemical vapor deposition of silicon dioxide using tetraethoxyorthosilane source gas.

13. The process of claim 11, wherein the step of depositing a silicon dioxide layer comprises chemical vapor deposition of silicon dioxide using tetraethoxyorthosilane source gas.

14. The process of claim 11, wherein the step of applying convective energy is performed at a temperature between 700° and 900° C.

15. A process for fabricating a semiconductor device comprising the steps of:
    providing a semiconductor substrate having a gate electrode forming material thereon;
    implanting halogenated boron atoms into the gate forming material;
    forming a refractory-metal silicide layer on the gate forming material, the refractory-metal silicide layer having a first halogen concentration therein;
    depositing a silicon dioxide layer overlying the refractory-metal silicide layer;
    annealing the semiconductor substrate to diffuse fluorine from the refractory-metal silicide layer and into the silicon dioxide layer, wherein the step of
    annealing comprises substeps of:
        applying radiant energy; and
        applying convective energy; and
    removing the silicon dioxide layer.

16. The process of claim 15, wherein the step of implanting halogenated boron atoms comprises implanting boron difluoride.

17. The process of claim 15, wherein the step of forming a refractory-metal silicide layer comprises chemical vapor deposition using tungsten hexafluoride to form a tungsten silicide layer.

* * * * *